(12) United States Patent
Lue

(10) Patent No.: US 10,978,485 B2
(45) Date of Patent: Apr. 13, 2021

(54) VERTICAL-CHANNEL FERROELECTRIC FLASH MEMORY

(71) Applicant: MACRONIX INTERNATIONAL CO., LTD., Hsinchu (TW)

(72) Inventor: Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/749,806

(22) Filed: Jan. 22, 2020

(65) Prior Publication Data

US 2021/0074725 A1    Mar. 11, 2021

Related U.S. Application Data

(60) Provisional application No. 62/897,398, filed on Sep. 9, 2019.

(51) Int. Cl.
*H01L 27/11597* (2017.01)
*H01L 23/528* (2006.01)
(Continued)

(52) U.S. Cl.
CPC ...... *H01L 27/11597* (2013.01); *G11C 11/223* (2013.01); *G11C 11/2273* (2013.01);
(Continued)

(58) Field of Classification Search
CPC ......... H01L 27/11597; H01L 27/11592; H01L 29/517; H01L 29/516; H01L 23/528;
(Continued)

(56) References Cited

U.S. PATENT DOCUMENTS 6,737,689 B1   5/2004   Schlosser et al.
8,933,516 B1   1/2015   Wu et al.
(Continued)

FOREIGN PATENT DOCUMENTS

TW   201515224 A    4/2015
TW   201913963 A    4/2019
WO   2016053453 A1  4/2016

OTHER PUBLICATIONS

Caillat et al., "3DNAND GIDL-Assisted Body Biasing for Erase Enabling CMOS Under Array (CUA) Architecture," IMW, Monterey, Ca May 14-17, 2017, 27 pages.
(Continued)

*Primary Examiner* — Tri M Hoang
(74) *Attorney, Agent, or Firm* — Haynes Beffel & Wolfeld LLP

(57) ABSTRACT

A device based on 2T vertical ferroelectric memory cells includes a plurality of select gate lines in a first layer, and a plurality of word lines in a second layer, with a plurality of vertical channel structures disposed operably with the select gate lines and word lines. A vertical channel structure of a memory cell in the plurality is disposed orthogonally relative to a corresponding select gate line and a corresponding word line, and forms a channel for the vertical select transistor and the vertical ferroelectric memory transistor. Ferroelectric material is disposed at cross-points between the vertical channel structure and the corresponding word line. A gate dielectric material is disposed at cross-points between the vertical channel structure and the corresponding select gate line. A NOR architecture memory uses the 2T vertical ferroelectric memory cells.

20 Claims, 11 Drawing Sheets

(51) Int. Cl.
  *H01L 27/11592* (2017.01)
  *H01L 29/51* (2006.01)
  *H01L 29/78* (2006.01)
  *G11C 11/22* (2006.01)

(52) U.S. Cl.
  CPC ........ *G11C 11/2275* (2013.01); *H01L 23/528* (2013.01); *H01L 27/11592* (2013.01); *H01L 29/516* (2013.01); *H01L 29/517* (2013.01); *H01L 29/78391* (2014.09)

(58) Field of Classification Search
  CPC ........... H01L 29/78391; G11C 11/2275; G11C 11/223; G11C 11/2273
  See application file for complete search history.

(56) References Cited

U.S. PATENT DOCUMENTS

| | | | |
|---|---|---|---|
| 9,337,210 | B2 | 5/2016 | Karda et al. |
| 9,520,445 | B2 | 12/2016 | Schmidt et al. |
| 9,818,848 | B2 | 11/2017 | Sun et al. |
| 10,090,316 | B2 | 10/2018 | Ootsuka |
| 2010/0117138 | A1 | 5/2010 | Huerta et al. |
| 2013/0307053 | A1 | 11/2013 | Polishchuk et al. |
| 2017/0178712 | A1* | 6/2017 | Van Houdt ........... G11C 11/223 |
| 2017/0345479 | A1* | 11/2017 | Chih .................. G11C 11/2275 |
| 2019/0043868 | A1* | 2/2019 | Hasnat ................. H01L 21/185 |
| 2019/0067325 | A1 | 2/2019 | Yano |
| 2019/0311756 | A1 | 10/2019 | Sharma et al. |

OTHER PUBLICATIONS

James et al., "TechInsights memory technology update from IEDM18—NAND Flash Technology," www.techinsights.com, Apr. 11, 2019, 19 pages.
Lue et al., "Device Modeling of Ferroelectric Memory Field-Effect Transistor (FeMFET)," IEEE Trans. on Electron Devices, vol. 49, No. 10, Oct. 2002, 9 pages.
McLellan, Paul, "Imec Technology Forum US," Cadence White Paper, Jul. 11, 2018, 5 pages.
Mulaosmanovic, et al., "Ferroelectric FETs With 20-nm-Thick HfO2 Layer for Large Memory Window and High Performance," IEEE Trans. on Electron Devices, vol. 66, No. 9, Sep. 2019, 6 pages.
Peng et al., "Nanocrystal-Embedded-Insulator (NEI) Ferroelectric FETs for Negative Capacitance Device and Non-Volatile Memory Applications," Nanocale Research Letters 14, Article No. 115, Apr. 1, 2019, 9 pages.
Si, et al., "On the Ferroelectric Polarization Switching of Hafnium Zirconium Oxide in Ferroelectric/Dielectric Stack," ACS Appl. Electron. Mater., vol. 1, No. 5, May 8, 2019, 745-751.
YMTC White Paper on Xtacking, www.ymtc.com, as early as Dec. 2018, 2 pages.
TW Office Action with English Translation from Application No. 109121198 dated Jan. 7, 2021, 8 pages.

* cited by examiner

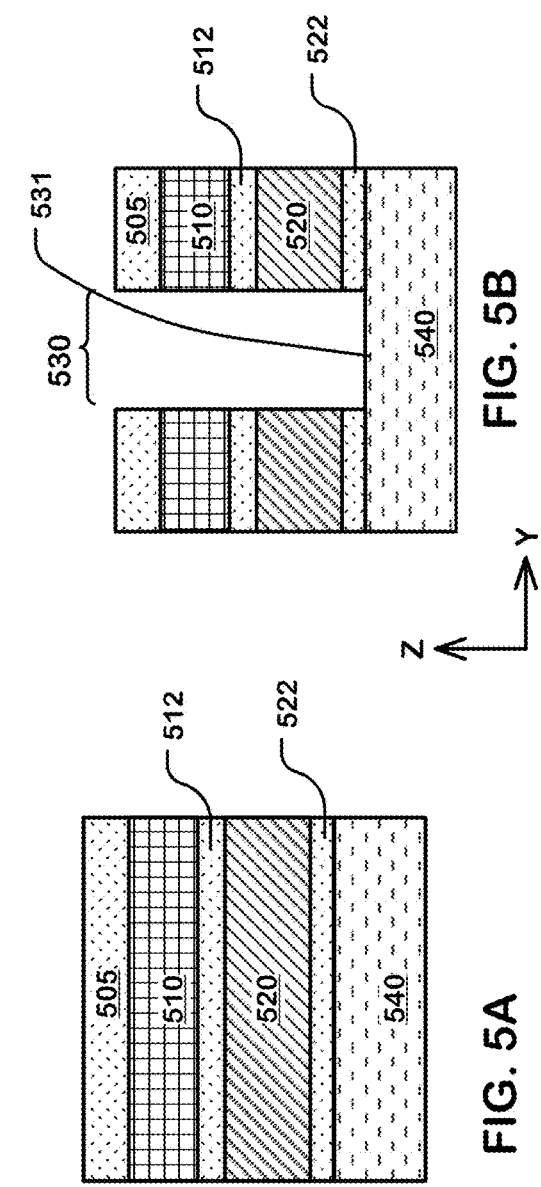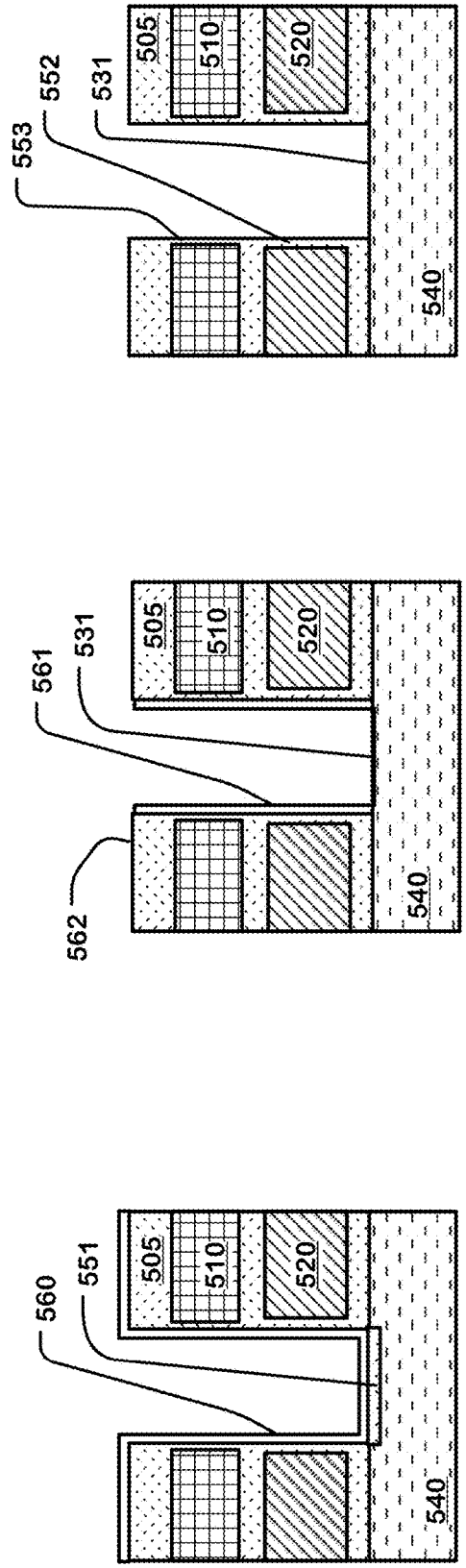

| Operation | | Bias Condition |
|---|---|---|
| Program | Select Gate Line | Selected Vpgm: 0V / Unselected 0V |
| | Word Line | Selected Vpgm: +5-8V / Unselected 0V |
| | Drain BL | Selected 0V / Unselected Vpgm/2 |
| | Source | 0V |
| Erase | Select Gate Line | 0V |
| | Word Line | -5V |
| | Drain | +5V |
| | Source | 0V |
| Read | Select Gate Line | Selected: 1V or VCCQ / Unselected: 0V |
| | Word Line | Selected: 0V / Unselected: 0V |
| | Drain BL | Selected: 1V or VCCQ / Unselected: 0V |
| | Source | 0V |

VERTICAL-CHANNEL FERROELECTRIC FLASH MEMORY

PRIORITY APPLICATION

This application claims the benefit of U.S. Provisional Patent Application No. 62/897,398 filed 9 Sep. 2019, which application is incorporated herein by reference.

BACKGROUND

Field

The present invention relates to nonvolatile memory based on ferroelectric FETs, and integrated circuits deploying the same.

Description of Related Art

The ferroelectric field-effect transistor (FeFET) has been under investigation as a type of nonvolatile memory for some time. See, Lue, et al., "Device Modeling of Ferroelectric Memory Field-Effect Transistor (FeMFET)," IEEE Transactions on Electron Devices, Vol. 49, No. 10, October 2002.

It is desirable to provide a memory architecture based on FeFETs that can support high density, and lower power operation.

SUMMARY

A ferroelectric memory is described suitable for low power, high density implementations. A memory described herein comprises a plurality of two transistor ("2T") vertical ferroelectric memory cells, where each memory cell comprises a vertical select transistor and a vertical ferroelectric memory transistor in series between a bit line and a reference line.

A plurality of 2T vertical ferroelectric memory cells can be implemented using a plurality of select gate lines in a first layer and a plurality of word lines in a second layer disposed in a stack, with a plurality of vertical channel structures disposed operably with the select gate lines and word lines. A vertical channel structure of a memory cell in the plurality is disposed orthogonally relative to a corresponding select gate line and a corresponding word line, and forms a channel for the vertical select transistor and the vertical ferroelectric memory transistor. Ferroelectric material is disposed at cross-points between the vertical channel structure and the corresponding word line. A gate dielectric material is disposed at cross-points between the vertical channel structure and the corresponding select gate line.

The ferroelectric memory transistor can have a gate-all-around structure, wherein the vertical channel structure is disposed through and surrounded by the corresponding word line. In other embodiments, the ferroelectric memory transistors can have a single gate, vertical channel structure, with memory transistors formed on opposing sides of a frustum of the vertical channel structure aligned with one layer of word lines, with a first word line on one side and a second word line on the other. In yet other embodiments, the ferroelectric memory transistors can have a single gate, vertical channel structure, with memory transistors formed on hemicylindrical vertical channel structures (e.g. opposing sides of a split circular cylindrical vertical channel structure).

The memory cells can have only two transistors (the vertical select transistor and the vertical ferroelectric memory transistor) with no other active component between a reference line and a bit line.

The ferroelectric material can comprise hafnium oxide, including for example silicon-doped hafnium oxide and zirconium-doped hafnium oxide.

A memory array as described herein can be implemented in a thin integrated circuit structure, with logic circuitry beneath the memory array, using for example CMOS under array CuA technology. Alternatives also can be implemented with logic circuitry overlying the memory array. These techniques can reduce the die size required to implement integrated circuits deploying the memory technology described herein.

In general, a 2T vertical cell NOR memory technology is described based on ferroelectric memory material. Memory based on this technology can operate with low power and high speed, with program and erase operations resistant to over-erase and over-program conditions. A 2T vertical cell NOR memory technology is described suitable for implementation in high density integrated circuits.

Other aspects and advantages of the present invention can be seen on review of the drawings, the detailed description and the claims, which follow.

BRIEF DESCRIPTION OF THE DRAWINGS

FIGS. 5A, 5B, 5C, 5D, 5E, 5F, 5G, 5H, 5I, 5J, 5K, 5L illustrate stages in a manufacturing process for memory cells as described herein.

DETAILED DESCRIPTION

A detailed description of embodiments of the present invention is provided with reference to the FIGS. 1-12.

Figure 1:
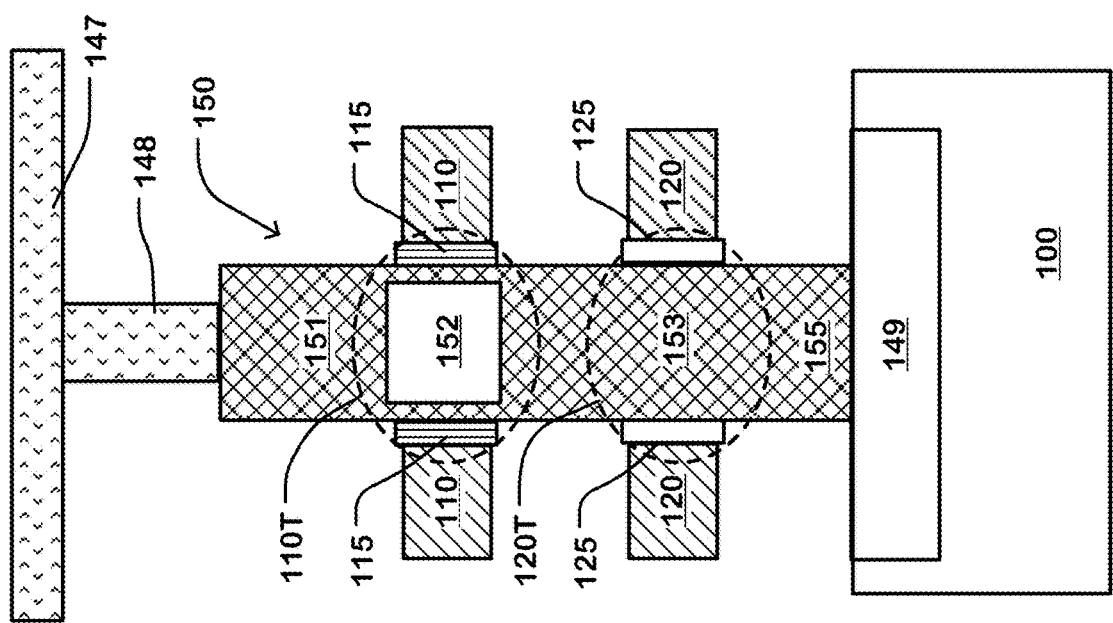
FIG. 1 is a simplified illustration of a 2T vertical ferroelectric memory cell as described herein.

FIG. 1 illustrates a vertical channel, two-transistor ferroelectric memory cell. The memory cell can be formed on an integrated circuit substrate, having a reference conductor 149 thereon. In the illustrated example, the reference conductor 149 can comprise any suitable conductive material including, as illustrated, an n-type doped semiconductor region in a p-type body 100 of semiconductor, which may comprise bulk semiconductor of an integrated circuit chip, a semiconductor layer over an insulator, or other types of conductor structures. A vertical channel structure 150 is disposed on, and in electrical contact with, the reference conductor 149.

The vertical channel structure 150, in this example, extends orthogonally through a select gate conductor 120 and a word line conductor 110. A contact plug 148 contacts the top of the vertical channel structure 150, and connects the vertical channel structure 150 to an overlying bit line 147. In this example, the connection from the top of the vertical channel structure 150 to the overlying bit line 147 is passive, without intervening active devices such as transistors or diodes. In this sense, the vertical channel conductor 150 is in electrical contact with the overlying bit line 147.

A gate dielectric 125 is disposed between the select gate conductor 120 and the vertical channel structure 150 in the region 153. As a result, a select gate transistor 120T disposed on the vertical channel structure 150 can be used to connect or disconnect the vertical channel structure to the reference line conductor 149.

Ferroelectric memory material 115 is disposed between the word line conductor 110 and the vertical channel structure 150 in the region 152. As a result, a ferroelectric memory cell transistor 110T, disposed on the vertical channel structure 150, and can be used to store data as a function of residual polarity of the ferroelectric memory material 115. The ferroelectric material can comprise hafnium oxide, such as silicon-doped hafnium oxide and zirconium-doped hafnium oxide, in some embodiments. Other ferroelectric materials may be used as well.

As illustrated in FIG. 1, the vertical channel structure 150 has a region 151 which can comprise a semiconductor or other type of conductive plug or filler, configured for electrical connection to the contact plug 148. Also, the vertical channel structure 150 can be characterized as comprising a region 152, which in this example comprises a void inside a cylindrical section of the vertical channel structure 150. The void is formed as a result of the formation of a hollow core structure having thin body structures on the sidewalls of the vertical channel structure 150 in the region 152. The vertical channel structure 150 also includes a region 153 which is configured to provide a body for the select gate transistor 120T. In this example, the region 153 of the vertical channel structure 150 is implemented using a solid core of the semiconductor material. The vertical channel structure 150 also includes a region 155 in the illustrated example, which is configured to make electrical contact with the reference conductor 149, without intervening active devices.

Figure 2:
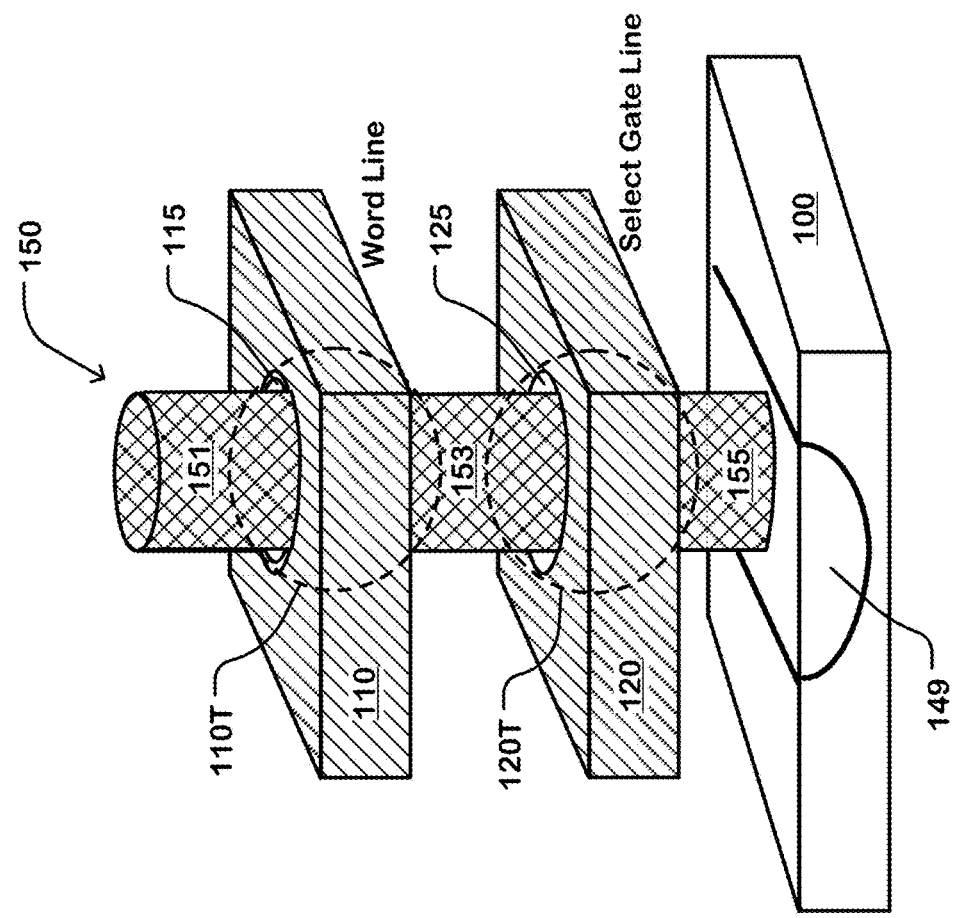
FIG. 2 is a simplified perspective view of a gate-all-around implementation of a 2T vertical ferroelectric memory cell as described herein.

FIG. 2 is a perspective view of a two-transistor ferroelectric memory cell like that of FIG. 1, in a gate-all-around configuration. In this example, the reference numerals used in FIG. 1 are also used in FIG. 2, for like structures. As illustrated, the word line conductor 110 and the select gate conductor 120 comprise strips of conductive materials separated by insulating material, and arranged in a stack. Vertical channel structure 150 is disposed in a via through the stack. A gate dielectric material 125 is disposed at the cross-point of the vertical channel structure 150 and the select gate conductor 120. Likewise, the ferroelectric memory material 115 disposed at the cross-point of the word line conductor 110 and the vertical channel structure 150. Reference line conductor 149 is a doped region in a semiconductor body 100 in this example.

In the example shown in FIGS. 1 and 2, the ferroelectric memory transistor 110T is disposed in the upper layer of the stack. In other embodiments, the bit line may be disposed under the stack, and the ferroelectric memory transistor can be disposed as the lower layer of the stack, with the select gate transistor 120T being disposed between the memory transistor and the bit line.

Figure 3:
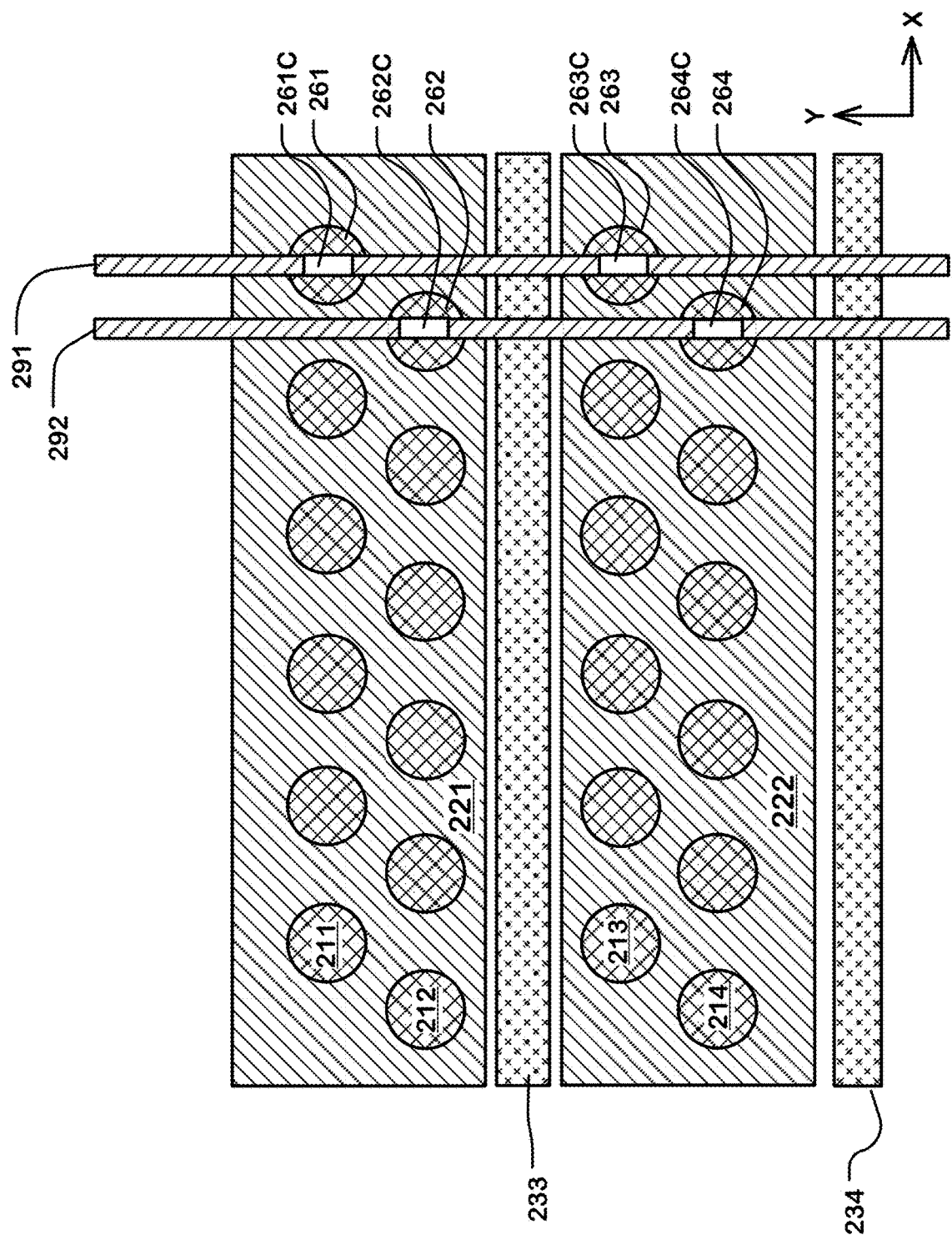
FIG. 3 is a layout view of an array of gate all around 2T vertical ferroelectric memory cells according to an embodiment described herein.

FIG. 3 is a layout view of an array of 2T vertical ferroelectric memory cells as described herein. The layout, an array of vertical channel structures (e.g. 211, 212, 261, 262), is disposed through a stack including a word line conductor 221. Also, an array of vertical channel structures (e.g. 213, 214, 263, 264) is disposed through a stack including word line conductor 222. The reference line conductor (not shown), such as conductor 149 of FIG. 1, is disposed beneath the array of vertical channel structures. A connector 233, which in this embodiment is wall-shaped, for example formed by filling a trench, makes contact to the reference conductor beneath the array of vertical channel structures that are through the word line conductor 221. Likewise, connector 234, which can be wall-shaped as discussed above, makes contact to the reference conductor beneath the array of vertical channel structures that are through the word line conductor 222. In other alternatives connection can be made between an overlying conductor and the reference conductor using a sequence of vertical plugs.

Overlying bit lines (e.g. 291, 292), are disposed over the array of vertical channel structures in this example. The bit line 291 is connected by contact 261C to the vertical channel structure 261, and by contact 263C to the vertical channel structure 263. The bit line 292 is connected by contact 262C to the vertical channel structure 262, and by contact 264C to the vertical channel structure 264.

Figure 4A:
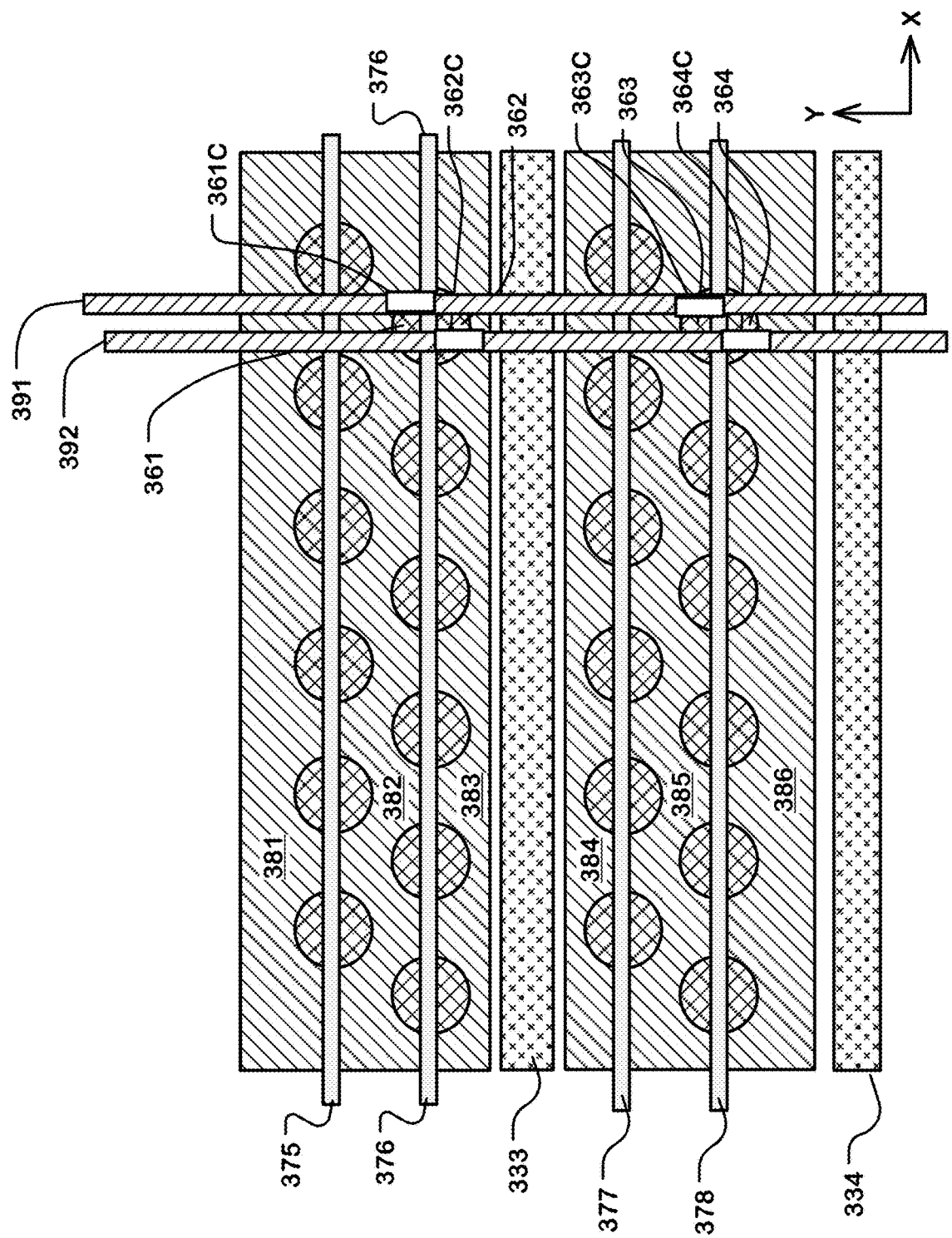
FIG. 4A is a layout view of an array of 2T vertical ferroelectric memory cells according to an alternative embodiment, with hemicylindrical vertical channel structures.

FIG. 4A illustrates an alternative embodiment, based on a hemicylindrical vertical channel architecture. In this embodiment, slits 375, 376, 377, 378 are cut through the stack along the centerlines of the circular cylindrical vertical channel structures to form hemicylindrical vertical channel structures. As a result of the slits, the word line conductors are divided into word line conductors 381, 382, 383, 384, 385, 386.

The reference line conductor (not shown) such as conductor 149 of FIG. 1, is disposed beneath the array of vertical channel structures. A connector 333, which in this embodiment is wall-shaped for example formed by filling a trench, makes contact to the reference conductor beneath the array of vertical channel structures that are through the word lines. Likewise, connector 334, which can be wall-shaped as discussed above, makes contact to the reference conductor beneath the array of vertical channel structures that are through the word lines.

Overlying bit lines (e.g. 391, 392) are disposed over the array of vertical channel structures. The bit line 391 is connected by contact 361C to the hemicylindrically shaped vertical channel structure 361, which is coupled with the word line conductor 382. Also, bit line 391 is connected by contact 363C to the hemicylindrically shaped vertical channel structure 363, which is coupled with the word line conductor 385.

Bit line 392 is connected by contact 362C to the hemicylindrically shaped vertical channel structure 362, which is coupled with the word line conductor 383. Also, bit line 392 is connected by contact 364C to the hemicylindrically shaped vertical channel structure 364, which is coupled with the word line conductor 386. The vertical channel structures are adjacent to, but not surrounded by, the corresponding word lines and select gate lines, with ferroelectric memory transistors and select transistors at the cross-points.

Figure 4B:
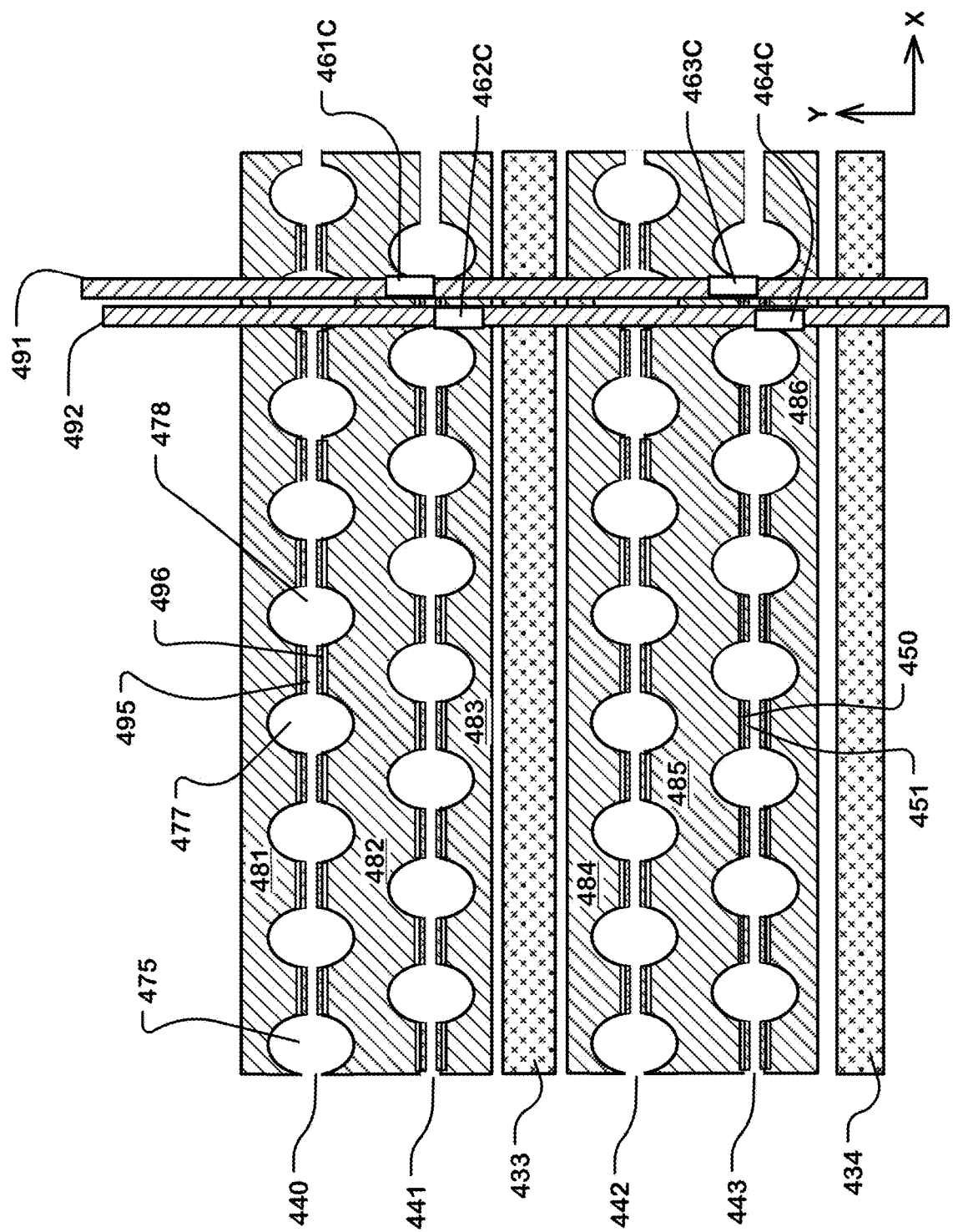
FIG. 4B is a layout view of an array of 2T vertical ferroelectric memory cells according to an alternative embodiment, with a single gate vertical channel structure having memory cells on opposing sides of the vertical channel structure.
Figure 6:
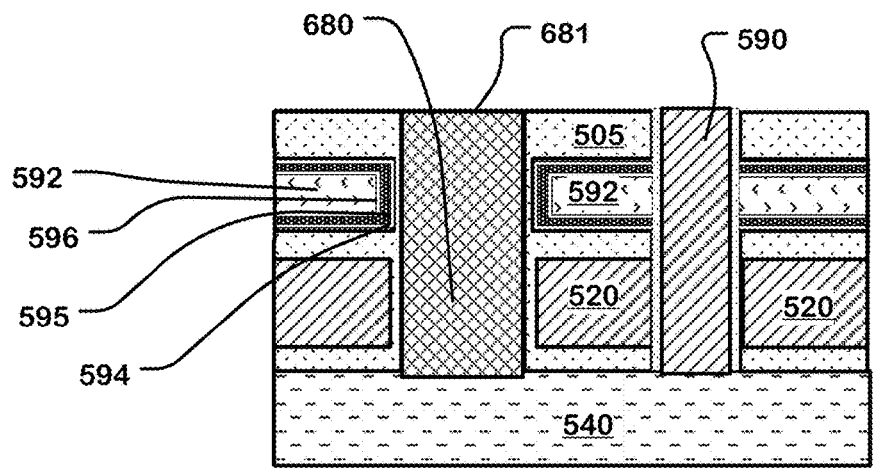
FIG. 6 illustrates an alternative embodiment of a 2T vertical memory cell having a solid plug vertical channel structure.
Figure 7:
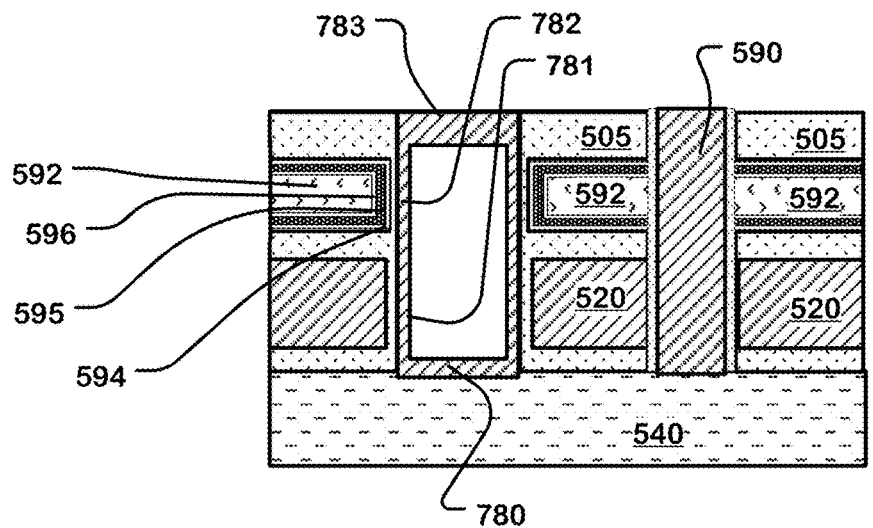
FIG. 7 illustrates another alternative embodiment of a 2T vertical memory cell including a vertical channel structure with a hollow core.

FIG. 4B illustrates yet another embodiment, based on vertical channel structures formed on sidewalls of trenches. In this embodiment, trenches 440-443 are cut through the stack, and lined as shown in FIG. 5L, 6 or 7, over the layer of ferroelectric material (e.g. 450) in the memory cell level of the structure, with a layer of channel material (e.g. 451). Then, a sequence of holes (e.g. 475, 477, 478) is cut along each trench to divide the layers of ferroelectric memory material and channel material into an array of vertical channel structures including memory cells and switch transistors at each layer, including word lines (e.g. 481, 482, 483, 484, 485, 486) at each layer.

The reference conductor is disposed beneath the array of vertical channel structures. Connector 433, which in this embodiment is wall-shaped as discussed above, makes contact to the reference conductor beneath the array of vertical channel structures. Likewise, connector 434, which can be wall-shaped as discussed above, makes contact to the reference conductor beneath the array of vertical channel structures.

The vertical channel structures are formed on opposing sides of the trenches. For example, vertical channel structure 495 is disposed on a sidewall of the trench 440 between the holes 477 and 478. Also, vertical channel structure 496 is disposed on a sidewall of the trench 440 between the holes 477 and 478, opposite the vertical channel structure 495. As illustrated in the diagram, an array of vertical channel structures is formed on the sidewalls of trenches.

Overlying bit lines (only 491, 492 are shown) are disposed over the array of vertical channel structures for access to memory cells in the array. The bit line 491 is connected by contact 461C to a vertical channel structure on the sidewalls of trench 441, which is operatively coupled with word line 482. Also, the bit line 491 is connected by contact 463C to a vertical channel structure on the sidewalls of trench 443 which is operatively coupled to the word line 485. Bit line 492 is connected by contact 462C to a vertical channel structure on the sidewalls of trench 441 opposite to the vertical channel structure connected to contact 461C. The vertical channel structure connected bike to contact 462C Is operatively coupled to the word line 483. Also, the bit line 492 connected by contact 464C to a vertical channel structure on the sidewalls of trench 443, opposite to the vertical channel structure connected to contact 463C, and operably coupled to the word line 486.

The vertical channel structures are adjacent to, but not surrounded by the corresponding word lines and select gate lines, with ferroelectric memory transistors and select transistors at the cross-points.

These patterns of connections in FIGS. 3, 4A and 4B, including bit lines and word lines and an array of vertical channel structures, can be repeated to form a large-scale high density array. In some examples, the array can include for example 4 gigabits Gb of memory capacity or more, in a thin integrated circuit structure.

The illustrated structures include a plurality of select gate lines and a plurality of word lines, with the word lines in the top layer of the stack, with a plurality of vertical channel structures. Each vertical channel structure in the plurality is disposed orthogonally relative to a corresponding select gate line in the plurality of select gate lines to form a channel for the vertical select transistor and disposed orthogonally relative to a corresponding word line in the plurality of word lines to form a channel for the vertical ferroelectric memory transistor. In the embodiment of FIG. 3, each vertical channel structure in the plurality is disposed orthogonally relative to and surrounded by a corresponding select gate line in the plurality of select gate lines to form a channel for the vertical select transistor, and is disposed orthogonally relative to and surrounded by a corresponding word line in the plurality of word lines to form a channel for the vertical ferroelectric memory transistor.

Figure 5G:
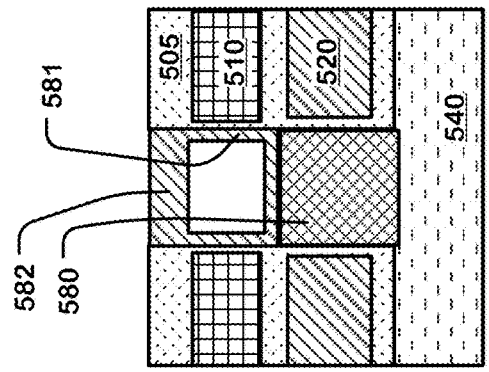
Figure 5H:
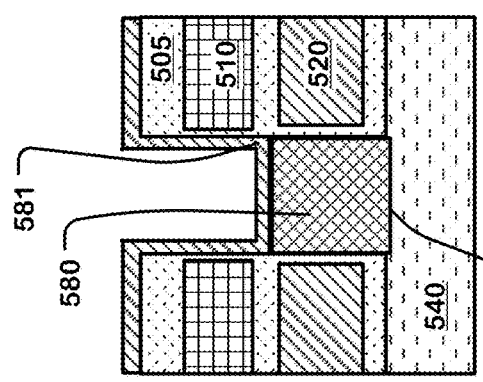
Figure 5I:
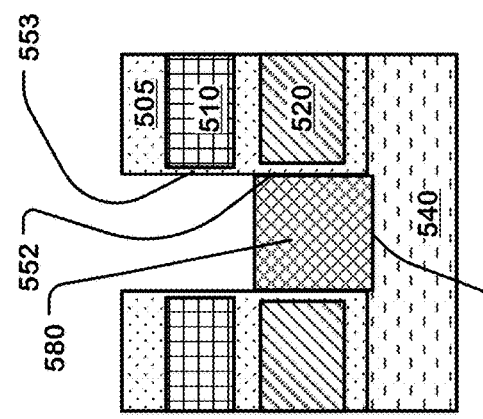
Figure 5J:
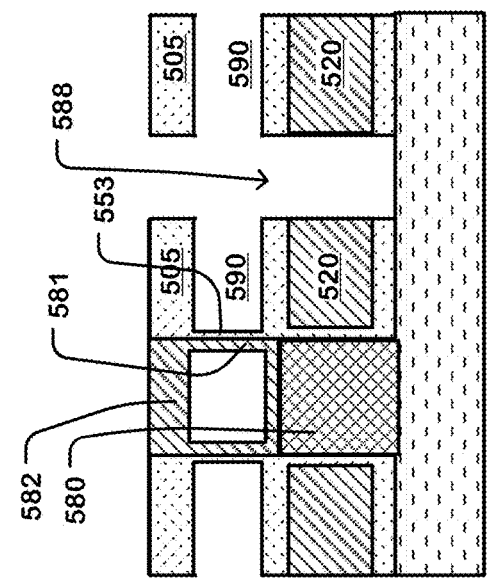
Figure 5K:
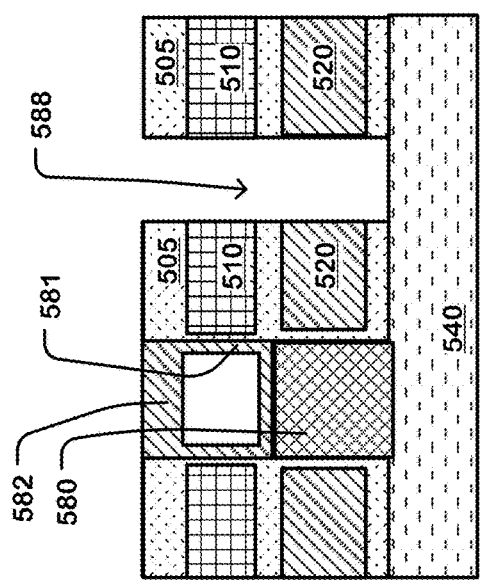
Figure 5L:
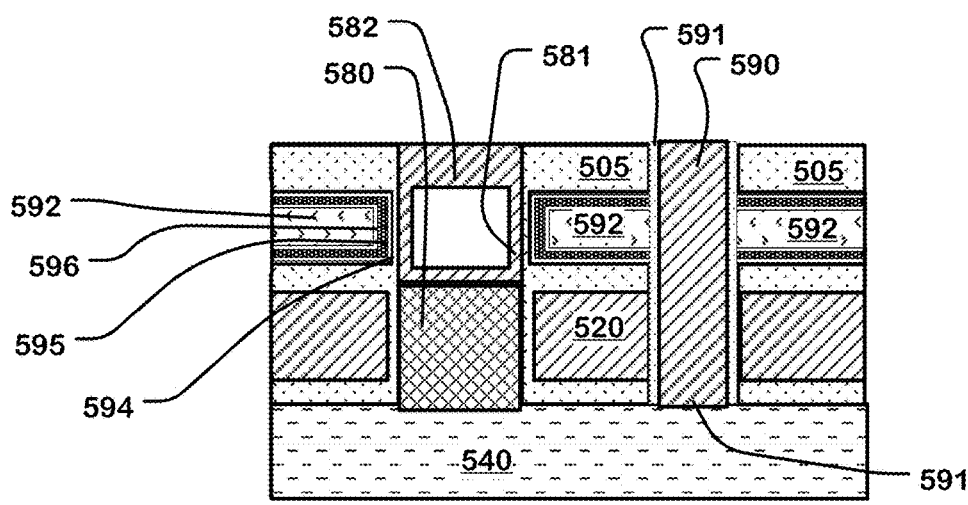

FIGS. 5A-5L illustrate stages in one example manufacturing process which can be used to form 2T vertical ferroelectric memory cells, which can be arranged in a NOR architecture memory array. In this example, the process begins as shown in FIG. 5A, with formation of a stack including a sacrificial layer 510, such as silicon nitride, over a conductive layer 520 such as a doped polysilicon (or other suitable gate conductor) separated by insulating layers 512, 522, such as silicon oxide, on a semiconductor substrate including a reference line conductor 540. The reference line conductor 540 can comprise an n-type doped silicon substrate. Also, silicon oxide layer 505 is formed on top of the sacrificial layer 510.

FIG. 5B illustrates the structure after formation of holes (e.g. 530) in which to form vertical channel structures through the stack, exposing the reference line conductor 540. FIG. 5C illustrates a structure after thermal oxidation, or other process which forms liner oxide 553 at the sacrificial layer 510 and liner oxide 552 at the conductive layer 520. In addition, liner oxide 551 is formed in the bottom of the hole in this example process, and removed in subsequent steps.

FIG. 5D illustrates a structure after formation of a spacer material 560 overlying the structure of FIG. 5C, including overlying the liner oxide 551 at the bottom of the hole. The spacer material can comprise a polymer, silicon nitride, polysilicon or other suitable material. FIG. 5E illustrates a structure after the spacer etch which removes the spacer material from the top 562 of the oxide layer 505, and at the bottom 531 of the hole. The spacer etch allows removal of the liner oxide 551 the bottom of the hole, while leaving the liner oxide 553, 552 on the sidewalls of the sacrificial layer 510 and the conductive layer 520.

FIG. 5F illustrates a structure after removal of the spacer 561, with the silicon liner oxide 552 and 553 remaining on the sidewall.

FIG. 5G illustrates the structure after formation of a semiconductor plug 580 in the hole, filling up to the level of, and slightly above, the top surface of the conductive layer 520. The semiconductor plug 580 can be formed by selective epitaxial growth of silicon, for example seeded by silicon in the reference line conductor 540. This makes a good electrical contact to the reference line conductor 540. The liner oxide 552 on the sidewall of the conductive layer 520 acts as a gate oxide for the select gate transistor.

FIG. 5H illustrates a structure after formation of a thin polysilicon layer 581 over the structure, lining the sidewalls of the hole. Polysilicon layer 581 provides a thin polysilicon channel for the ferroelectric memory cell to be formed at that level of the hole. As illustrated in FIG. 5I, the top of the vertical channel structure is filled by a plug structure 582, which can be formed by a deposition of the layer of polysilicon followed by an etch back or a chemical mechanical polishing step. This procedure leaves a void, or hollow core, beneath the plug structure 582, within channel polysilicon layer 581 at the level of the sacrificial layer 510.

FIG. 5J shows the structure which has been extended horizontally to allow for the view of the formation of a slit 588, or an array of holes or other types of openings, adjacent to the vertical channel structure. The slit 588 can correspond to the trench in which the connector 233 shown in FIG. 3 can be formed.

FIG. 5K illustrates a next step in which the sacrificial material at layer 510 is removed through the slit 588, leaving openings beneath the top oxide layer 505 and the intermediate oxide layer over the conductive layer 520, and exposing the silicon liner oxide 553 on the channel polysilicon layer 581 of the vertical channel structure.

FIG. 5L illustrates a structure after formation of the layers of memory material, the memory gate material for formation of word lines, and an insulating liner sidewall 591 and conductive material 590 in the slit 588. The process can include formation of an interfacial layer 594, such as a silicon nitride or other dielectric in contact with the silicon liner oxide 553 or if the liner 553 is removed with the thin channel semiconductor layer 581. On top of the interfacial layer 594, a layer of ferroelectric material 595, such as silicon-doped hafnium oxide, or zirconium-doped hafnium oxide, is deposited through the opening. Thereafter, a layer of titanium nitride 596 or other buffer conductor can be formed. This provides elements of a ferroelectric memory structure suitable for use to store data. The structure at this stage can be exposed to a post deposition anneal to activate the ferroelectric material by causing formation of the ferroelectric crystalline structure of the doped hafnium oxide. After the post deposition anneal, a layer of tungsten or other metal gate word line material can be deposited filling the voids between the oxide layer 505, and the oxide layer on top of the conductive layer 520. Finally, the hole can be etched to remove excess material from the formation of the memory materials, an insulating liner sidewall 591 is formed by oxidation or by deposition, and a conductive material 590, such as a polysilicon or a metal such as tungsten, is deposited, forming contact with the underlying doped semiconductor reference line 540. The insulating liner 591 isolates the conductive material 590 in the hole from the conductive layer 520, and the word line material 592.

The structure shown in FIG. 5L illustrates a 2T vertical ferroelectric memory cell having an epitaxial silicon body for the select gate at the level of the conductive layer 520, with a hollow core providing a thin-channel polysilicon body for the memory gate at the level of the word line conductor 592.

FIG. 6 and FIG. 7 illustrate alternative structures. In FIG. 6, the epitaxial silicon body 680 grown by selective epitaxial growth, is used as the semiconductor body for both the ferroelectric memory transistor, and the select gate transistor, with the top surface 681 planarized using chemical mechanical polishing or other technique. In this embodiment, the 2T vertical ferroelectric memory cell with an epitaxial silicon body 680 for the select gate transistor and the memory gate transistor, is provided which can have a relatively higher drain saturation current Idsat, with a tighter distribution, than may be available using thin channel structures.

FIG. 7 illustrates an embodiment, in which thin-channel semiconductor layers 781, 782 are utilized for both the ferroelectric memory transistor and the select gate transistor, with layer 780 at the bottom of the hole in contact with the reference line conductor 540, and a plug structure 783 at the top surface.

The top surfaces, including the plug structure 582 in FIG. 5L, the top surface 681 of the body 680 in FIG. 6, and the plug structure 783 in FIG. 7 are configured for connection to an overlying bit line, such as through an interlayer plug or other connector, as illustrated in FIG. 1.

The process illustrated in FIGS. 5A-5L can be modified to produce a hemicylindrical vertical channel structure like that shown in FIG. 4A. One modification which can be used involves performing a slit etch aligned with the vertical channel structures in the structure at the stage shown in FIG. 5I. This divides the vertical channels into first and second hemicylindrically shaped vertical channel structures, each having a select gate transistor and a memory gate transistor. Similar techniques can be applied to the structure shown in FIGS. 6 and 7, for the purpose of implementing hemicylindrically shaped vertical channel structures.

Figure 8A:
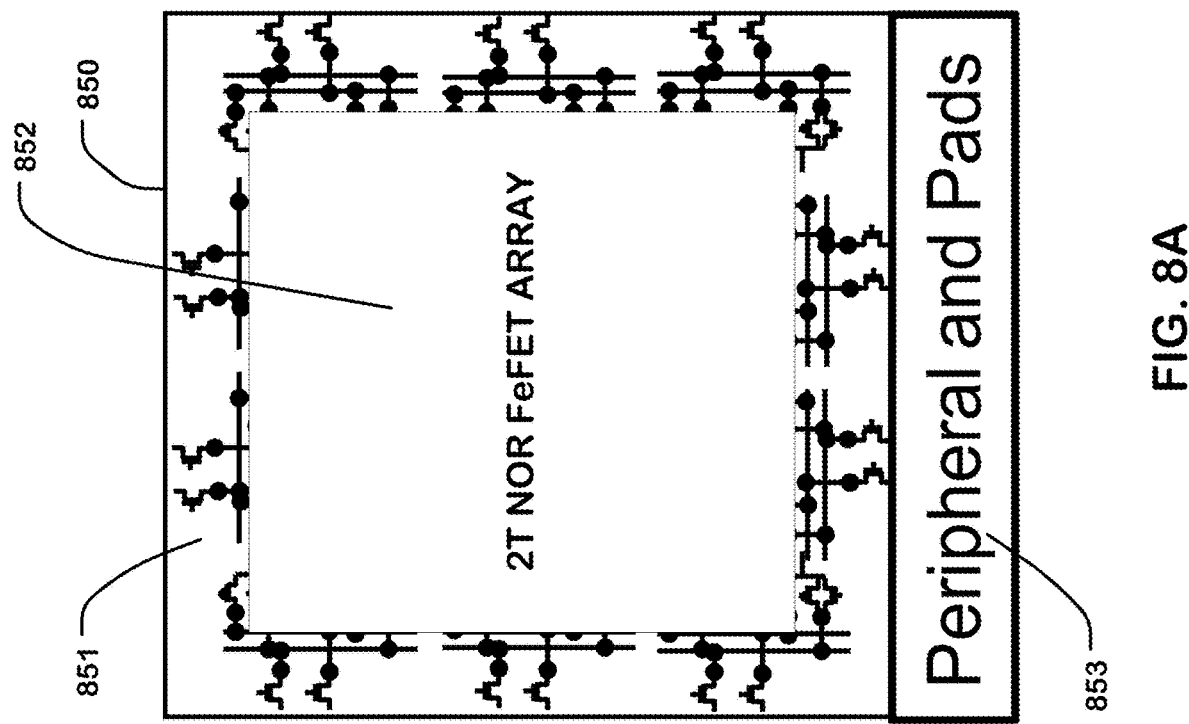
FIG. 8A is a simplified layout view of an integrated circuit like that of FIG. 8.
Figure 8:
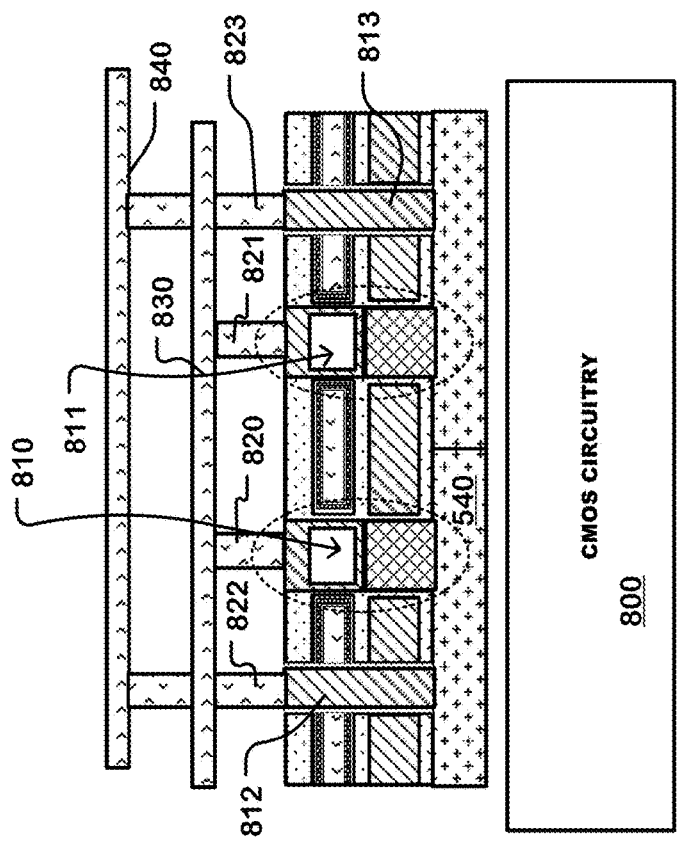
FIG. 8 is a simplified diagram of a CMOS under array implementation of a memory array with logic circuitry as described herein on an integrated circuit.

FIG. 8 illustrates an embodiment in which the array of 2T vertical ferroelectric memory cells is implemented over CMOS circuitry 800 used to implement logic circuitry on the same integrated circuit. An array of the 2T vertical memory cells configured in a NOR architecture for example can be implemented in a thin structure, including the reference line conductor 540, the select gate line, the word line and overlying bit lines. This facilitates implementation of the array in a way that can partially or completely overlie CMOS circuitry, allowing for efficient utilization of area on an integrated circuit.

As shown in FIG. 8, CMOS circuitry 800 is below reference line conductor 540. An array of vertical channel structures 810, 811 is disposed over and in contact with the reference line conductor 540. The ferroelectric memory transistor and select gate transistor in each memory cell is disposed at the cross-points of the vertical channel structures 810, 811 and the word line as discussed above. Also, conductive elements 812, 813 connect to the underlying reference line conductor 540. Overlying bit lines (e.g. 830) are connected by vertical contact plugs 820, 821 to the vertical channel structures 810, 811, respectively. Overlying reference line 840, in this example, is connected to the conductive elements 812, 813, by vertical contact plugs 822, 823, respectively.

FIG. 8A is a simplified layout view of an integrated circuit 850, having a 2T vertical ferroelectric memory array 852 disposed in a layer over CMOS circuits 851 on the integrated circuit 850. The CMOS circuits implement, for example, decoders or sense amplifiers for the array, and other circuitry as suits the needs of particular implementations. In this example, other peripheral circuits and input-output pads are arranged on the integrated circuit 850 in area 853. The utilization of CMOS under the array with the 2T vertical cell, NOR architecture, ferroelectric memory described herein can provide substantial savings in die size. The low power, high speed operation of the memory technology described herein makes it suitable for a wide variety of integrated circuit applications.

Figure 9:
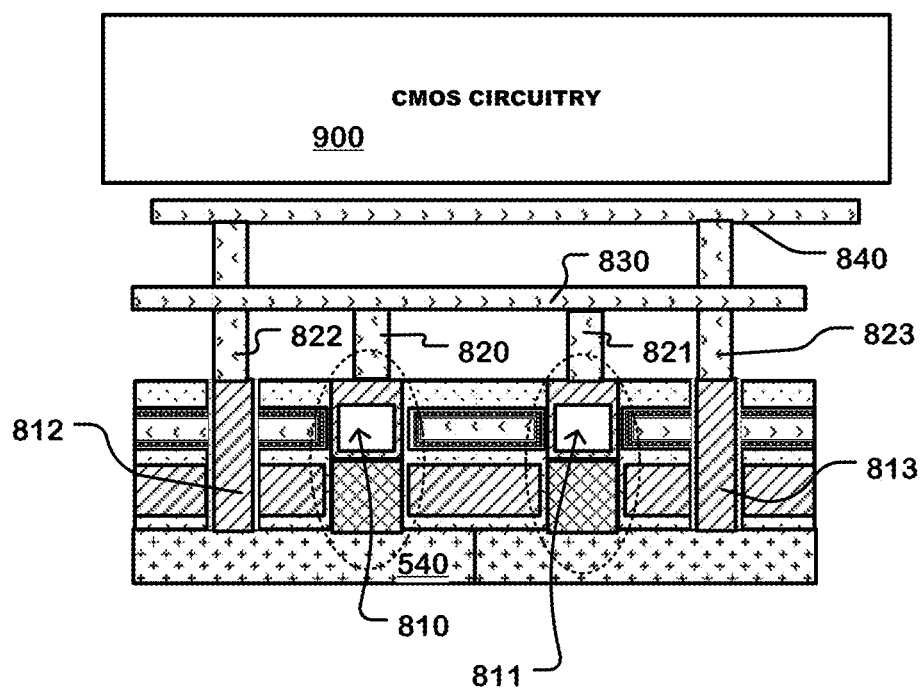
FIG. 9 is a simplified diagram of an embodiment having logic circuitry overlying the memory array as described herein on an integrated circuit.

FIG. 9 illustrates yet another embodiment, which the 2T vertical cell, NOR architecture ferroelectric memory described herein can be implemented beneath CMOS circuitry on an integrated circuit. In this example, the memory technology is illustrated using the same reference numbers as shown in FIG. 8. A distinction from FIG. 9 is that the CMOS circuitry 900 is disposed over the metal layers used to implement bit lines and reference lines for the memory array.

The thin array structure described herein can be stacked in multiple memory planes, to provide high density, 3D memory devices.

Figures 10, 11:
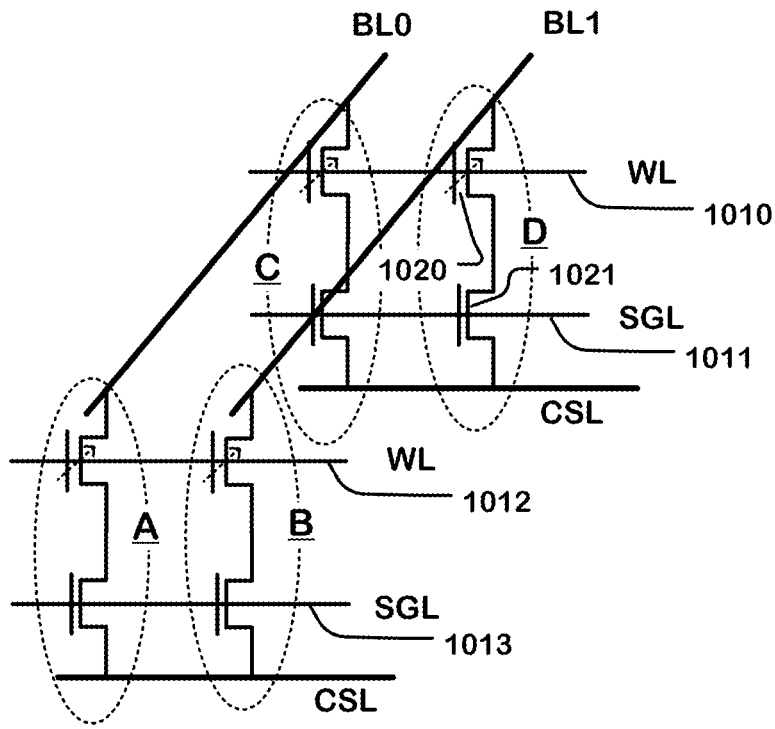
FIG. 10 is a schematic circuit diagram of a portion of a NOR architecture memory array comprising a plurality of 2T vertical ferroelectric memory cells.
FIG. 11 is a table illustrating biasing conditions for program, erase and read operations for a 2T vertical ferroelectric memory array as described herein.

FIG. 10 is a schematic circuit diagram of a 2T NOR array using ferroelectric memory cell transistors as described herein. In the illustration, there are four 2-transistor ferroelectric memory cells: cell A, cell B, cell C and cell D. Each cell includes a ferroelectric transistor (e.g. 1020) in series with a select transistor (e.g. 1021). The ferroelectric transistor (e.g. 1020) is connected in compact embodiments without any intervening active device to the bit line. The select transistor (e.g. 1021) is connected in compact embodiments without any intervening active device to the common source line.

The cells A-D are disposed between bit lines BL0 and BL1, and one or more common source lines CSL. Word line WL 1010 is coupled to the ferroelectric transistors in cells C and D, which are coupled to the bit lines BL0 and BL1, respectively. Likewise, the select gate line SGL 1011 is coupled to the select transistors in cells C and D, which are coupled to the common source line CSL. Word line WL 1012 is coupled to the ferroelectric transistors in cells A and B, which are coupled to the bit lines BL0 and BL1, respectively. Likewise, the select gate line SGL 1013 is coupled to the select transistors in cells A and B, which are coupled to the common source line CSL.

The array illustrated in FIG. 10 is controlled by biasing circuitry and control logic on the integrated circuit for reading, program and erase operations. Representative bias conditions for such operations is illustrated in the table in FIG. 11.

For a program operation, an electric field can be established across the word line and bit line. Thus, in a program operation, the select gate line for selected and unselected cells can be biased at 0 V and left in a non-conducting off condition. The word line of the selected cell can be biased at a voltage on the order of positive 5 to positive 8 Volts. The unselected word line can be left at 0 V. The bit line (drain) on the selected cell can be biased at 0 V, while the bit line on the unselected cells can be biased at Vpgm/2, for example, which allows for implementation of the select gate with a relatively low punch through threshold. The common source line can likewise be left at 0 V. This program bias will induce the selected memory cell to be programmed to a low Vt threshold, which can be less than 0 V.

For an erase operation, a block erase operation can be implemented. For block erase, the word lines in the selected block can be biased at about −5 V, while the bit lines in the selected block can be biased at about positive 5 V. The select gate lines can be biased at about 0 V so that they remain off during the operation. Also, the common source lines can be biased at about 0 V. The use of divided voltages across bit lines and word lines produces an effective −10 V across the ferroelectric memory cell. This applied electric field will induce a high threshold erase state.

A read operation can be low-voltage and low power. For example, for a read operation, the select gate line for the selected cell can be biased at about 1 V or about the externally applied VCCQ level on the order of 1.8 V for example. This allows for read operations without requiring a charge pump. The unselected select gate line can be biased at about 0 V.

The selected word line can be biased at about 0 V, and the unselected word line biased at about 0 V. Because the programmed state threshold can be less than 0 V, a low-voltage read is accomplished. The bit line or drain of the selected cell can be biased without charge pumping at about 1 V, or VCCQ alternatively, while the unselected bit line can be biased about 0 V. Likewise, the common source line CSL can be biased at about 0 V during read.

Because of the select gate in the two transistor NOR array, over-program (threshold too low) or over-erase conditions (threshold too high) do not cause leakage or other types of operational problems. This reduces the complexity in the program and erase algorithms required for operation of the array.

Figure 12:
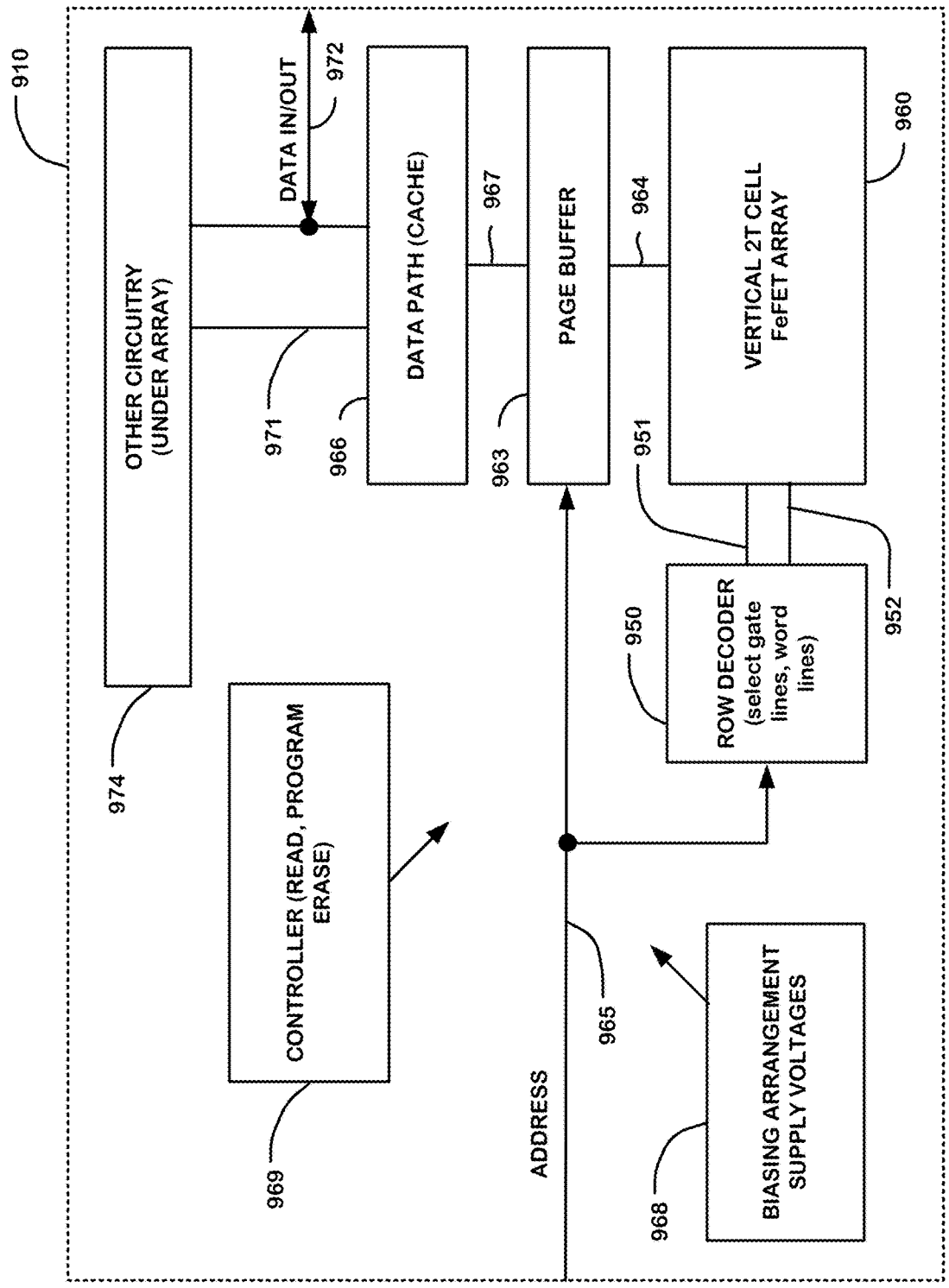
FIG. 12 is a simplified block diagram of an integrated circuit comprising a 2T vertical FeFET memory array.

FIG. 12 is a simplified block diagram of an integrated circuit memory device 910 that includes a 2T vertical ferroelectric memory array 960 as described herein. The integrated circuit includes peripheral circuitry, including a row decoder 950 which includes drivers for select gate lines 951 and word lines 952 which are coupled to the array 960. Also, the peripheral circuitry includes a page buffer 963 coupled to the bit lines 964 of the array. In addition, addresses are applied on line 965 to the page buffer 963, and the row decoder 950. In this simplified example, data path circuitry 966, such as cache memory, is coupled to the page buffer on line 967. The data path circuitry 966 can be coupled to other circuitry 974 by lines 971, and to data input/output lines 972 for example for communication off the chip. Biasing arrangement supply voltages 968 are included to apply the biasing voltage utilized in the read program and erase operations as above. Biasing circuitry for the common source line or common source lines (not shown) is also included.

A controller 969 includes logic to execute read operations, program operations and erase operations. Controller 969 can comprise a state machine formed by dedicated logic, by programmable array logic, by general purpose processors and by combinations of the same, in various embodiments.

The other circuitry 974 in this diagram is labeled with "under array". This suggests that logic circuitry on the integrated circuit memory device 910 can be implemented under the array 960 as discussed above, providing substantial savings in die area.

A 2T vertical memory cell utilizing ferroelectric memory technology which can be configured in a NOR architecture is described. The ferroelectric memory can be operated with relatively low voltages, including a read operation without requiring utilization of a charge pump or other voltage boosting circuitry on-chip. Use of the two-transistor cell protects against over-erase and over-program conditions, allowing simplified program and erase operations. The two-transistor cell can have a variety of vertical channel body structures. In one embodiment, the select gate uses a transistor body of silicon formed using selective epitaxial growth, while the memory gate uses a thin-film channel structure. In another embodiment, both gates can utilize epitaxial grown silicon as the transistor body. In yet another embodiment, both the select gate and the memory gate can use thin channel structures.

A variety of layout options can be implemented for the vertical channel two-transistor cells, including gate-all-around structures, single gate vertical channel structures, and hemicylindrical vertical channel structures. Furthermore, technology can be combined with CMOS under the array architectures, providing significant area savings.

In general, technology is provided utilizing ferroelectric memory technology with ferroelectric materials comprising hafnium oxides, suitable for low-power, high-speed flash memory.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory comprising:
a plurality of memory cells, each memory cell in the plurality of memory cells including a vertical select transistor having a vertical channel disposed orthogonally relative to a corresponding select gate line and a vertical ferroelectric memory transistor having a vertical channel disposed orthogonally relative to a corresponding word line, the vertical select transistor and vertical ferroelectric memory transistor in series between a bit line and a reference line.

2. The memory of claim 1, including:
a plurality of select gate lines and a plurality of word lines;
a plurality of vertical channel structures, each vertical channel structure in the plurality disposed orthogonally relative to a corresponding select gate line in the plurality of select gate lines to form said vertical channel for the vertical select transistor, and disposed orthogonally relative to a corresponding word line in the plurality of word lines to form said vertical channel for the vertical ferroelectric memory transistor.

3. The memory of claim 1, including
a plurality of select gate lines and a plurality of word lines;
a plurality of vertical channel structures, each vertical channel structure in the plurality disposed orthogonally relative to and surrounded by a corresponding select gate line in the plurality of select gate lines to form said vertical channel for the vertical select transistor and disposed orthogonally relative to and surrounded by a corresponding word line in the plurality of word lines to form said vertical channel for the vertical ferroelectric memory transistor.

4. The memory of claim 1, wherein the vertical ferroelectric memory transistor comprises said vertical channel, a layer of ferroelectric material, and a layer of word line material.

5. The memory of claim 4, wherein the layer of ferroelectric material comprises hafnium oxide.

6. The memory of claim 1, wherein the plurality of memory cells is configured in a NOR architecture.

7. The memory of claim 1, wherein the plurality of memory cells is disposed on a substrate, the substrate comprising logic circuitry, and the plurality of memory cells is arranged in an array overlying the logic circuitry.

8. The memory of claim 1, wherein the plurality of memory cells is disposed in an array on a substrate, and including logic circuitry overlying the array.

9. The memory of claim 1, including biasing circuitry to apply read, program and erase operations to the plurality of memory cells.

10. An integrated circuit memory, comprising:
a substrate;
a reference conductor on the substrate;
a stack including a select gate conductor layer and a word line conductor layer over the reference conductor on the substrate;
a plurality of vertical channel pillars arranged orthogonally relative to the select gate conductor layer and the word line conductor layer in the stack, and contacting the reference conductor;
ferroelectric memory material at cross-points of the vertical channel pillars and the word line conductor layer;
select gate dielectric material at cross-points of the vertical channel pillars and the select gate conductor layer; and
a plurality of bit lines over the plurality of vertical channel pillars and in contact with vertical channel pillars.

11. The integrated circuit memory of claim 10, wherein the reference conductor on the substrate comprises a doped semiconductor material.

12. The integrated circuit memory of claim 10, wherein the plurality of vertical channel pillars are surrounded by select gate conductor material in the select gate conductor layer and by word line conductor material in the word line conductor layer.

13. The integrated circuit memory of claim 10, wherein the select gate conductor layer is beneath the word line conductor layer in the stack.

14. The integrated circuit memory of claim 10, including control and biasing circuits to program data by applying an electric field to set a residual polarity in the ferroelectric memory material.

15. The integrated circuit memory of claim 10, including a dielectric layer between the ferroelectric memory material and the vertical channel pillars, and a conductive buffer layer between the ferroelectric memory material and the word line conductor layer.

16. The integrated circuit memory of claim 10, wherein the ferroelectric material comprises hafnium oxide.

17. The integrated circuit memory of claim 10, wherein memory comprising the plurality of vertical channel pillars is configured in a nor architecture.

18. The integrated circuit memory of claim 10, including logic circuitry, and wherein the stack overlies the logic circuitry.

19. The integrated circuit memory of claim 10, including logic circuitry, and wherein the logic circuitry overlies the stack.

20. A method for manufacturing a memory comprising:
forming a plurality of select gate lines and a plurality of word lines;
forming a plurality of vertical channel structures, each vertical channel structure in the plurality disposed orthogonally relative to a corresponding select gate line in the plurality of select gate lines to form a channel for the vertical select transistor, and disposed orthogonally relative to a corresponding word line in the plurality of word lines to form a channel for the vertical ferroelectric memory transistor;
forming ferroelectric memory material at cross-points of the vertical channel pillars and the word line conductor layer; and
forming select gate dielectric material at cross-points of the vertical channel pillars and the select gate conductor layer.

* * * * *